United States Patent
Smick et al.

(10) Patent No.: US 7,994,486 B2
(45) Date of Patent: Aug. 9, 2011

(54) SUBSTRATE SCANNER APPARATUS

(75) Inventors: Theodore Smick, Essex, MA (US); Ronald Horner, Auburndale, MA (US)

(73) Assignee: Applied Materials, Inc., Santa Clara, CA (US)

( * ) Notice: Subject to any disclaimer, the term of this patent is extended or adjusted under 35 U.S.C. 154(b) by 1218 days.

(21) Appl. No.: 11/589,312

(22) Filed: Oct. 30, 2006

(65) Prior Publication Data
US 2008/0141802 A1 Jun. 19, 2008

(51) Int. Cl.
*G01J 1/00* (2006.01)
(52) U.S. Cl. .............. 250/491.1; 250/492.1; 250/526; 250/522.1
(58) Field of Classification Search .............. None
See application file for complete search history.

(56) References Cited

U.S. PATENT DOCUMENTS

| | | | | |
|---|---|---|---|---|
| 5,194,748 | A * | 3/1993 | Aitken | 250/442.11 |
| 6,593,997 | B1 * | 7/2003 | Watson et al. | 355/53 |
| 6,603,531 | B1 * | 8/2003 | Binnard | 355/53 |
| 6,903,467 | B2 * | 6/2005 | Hazelton | 310/12.01 |
| 7,061,577 | B2 * | 6/2006 | Yuan et al. | 355/53 |
| 2003/0184724 | A1 * | 10/2003 | Ono et al. | 355/72 |
| 2003/0202167 | A1 * | 10/2003 | Binnard | 355/72 |
| 2003/0211410 | A1 * | 11/2003 | Irie | 430/22 |
| 2003/0218732 | A1 * | 11/2003 | Watson et al. | 355/53 |
| 2004/0046947 | A1 * | 3/2004 | Yuan et al. | 355/53 |
| 2004/0051854 | A1 * | 3/2004 | Tanaka et al. | 355/53 |
| 2004/0130220 | A1 * | 7/2004 | Hazelton | 310/12 |
| 2004/0194565 | A1 | 10/2004 | Okada et al. | |
| 2005/0232748 | A1 | 10/2005 | Vanderpot et al. | |

FOREIGN PATENT DOCUMENTS

| | | |
|---|---|---|
| JP | 03021894 | 1/1991 |
| JP | 03021894 A * | 1/1991 |
| JP | 03107639 | 5/1991 |
| JP | 030107639 | 5/1991 |

OTHER PUBLICATIONS

English Abstract of JP03021894.
English Abstract of JP030107639.

* cited by examiner

*Primary Examiner* — Robert Kim
*Assistant Examiner* — Andrew Smyth
(74) *Attorney, Agent, or Firm* — Dykema Gossett PLLC

(57) ABSTRACT

This invention relates to an apparatus for scanning substrates through an ion beam in the process chamber of an ion implanter. The apparatus comprises a substrate carriage and reaction mass carriage movably mounted to a fixed base. The substrate carriage is adapted to support a substrate holder. Movement of the substrate carriage results in movement of the substrate holder, and substrate mounted therein, through the ion beam. The reaction mass carriage moves in the opposite direction to the substrate carriage to counter any reaction forces exerted on the fixed base as a result of acceleration of the substrate carriage.

32 Claims, 9 Drawing Sheets

(a)

(b)

(c)

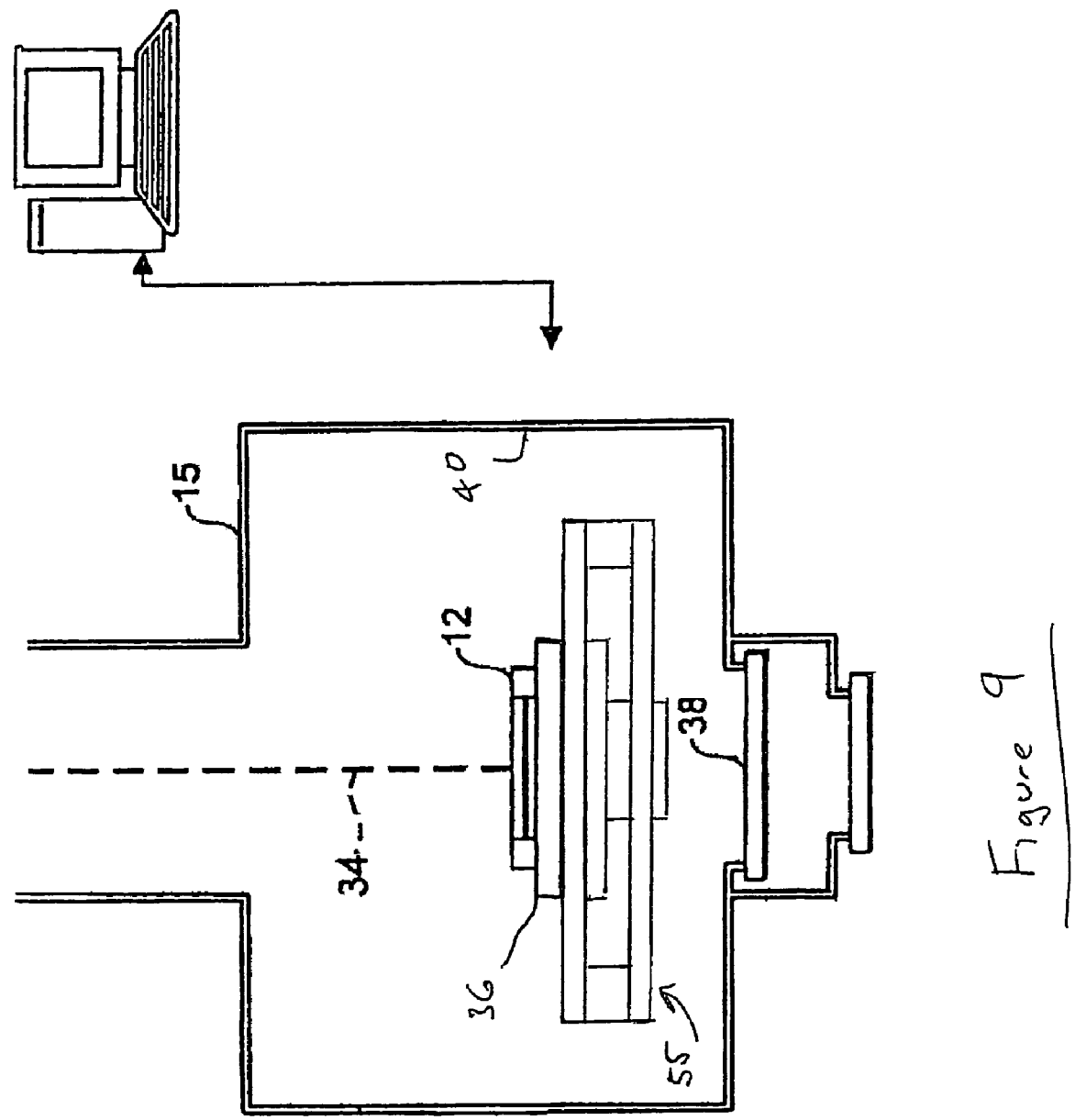

SUBSTRATE SCANNER APPARATUS

FIELD OF THE INVENTION

This invention relates to substrate scanner apparatus for use in ion implanters. The substrate scanner apparatus comprises a reaction mass movable in mutual reciprocation to movement of a substrate held in a substrate holder.

BACKGROUND OF THE INVENTION

Although the present invention is not limited to the field of ion implanters, this field corresponds to a contemplated application and provides a useful context for understanding the invention. Hence, there follows a description of ion implanters.

Ion implanters are well known and generally conform to a common design as follows. An ion source produces a mixed beam of ions from a precursor gas or the like. Only ions of a particular species are usually required for implantation in a substrate, for example a particular dopant for implantation in a semiconductor wafer. The required ions are selected from the mixed ion beam using a mass-analysing magnet in association with a mass-resolving slit. Hence, an ion beam containing almost exclusively the required ion species emerges from the mass-resolving slit to be transported to a process chamber where the ion beam is incident on a substrate held in place in the ion beam path by a substrate holder.

Often, the cross-sectional profile of the ion beam is smaller than the substrate to be implanted. For example, the ion beam may be a ribbon beam smaller than the substrate in one axial direction or a spot beam smaller than the substrate in both axial directions. In order to ensure ion implantation across the whole of the substrate, the ion beam and substrate are moved relative to one another such that the ion beam scans the entire substrate surface. This may be achieved by (a) deflecting the ion beam to scan across the substrate that is held in a fixed position, (b) mechanically moving the substrate whilst keeping the ion beam path fixed or (c) a combination of deflecting the ion beam and moving the substrate. For a spot beam, relative motion is generally effected such that the ion beam traces a raster pattern on the substrate. The present invention relates to mechanical scanning of a substrate.

Our U.S. Pat. No. 6,956,223 describes an ion implanter of the general design described above. A substrate is held in a moveable substrate holder. While some steering of the ion beam is possible, the implanter is operated such that the ion beam follows a fixed path during implantation. Instead, the substrate holder is moved along two orthogonal axes to cause the ion beam to scan over the substrate following a raster pattern.

The movement of a substrate in a typical raster pattern is illustrated in FIG. 1. The substrate is moved continuously in a single direction (the fast-scan direction) to complete a first scan line. The substrate is then stepped down a short distance orthogonally (in the slow-scan direction), and a second line is then scanned. This combination of scan lines and stepwise movement results in scanning of the whole surface of the substrate through the ion beam. It is desirable to reduce the time taken for such scans to increase throughput of the ion implanter. However, increasing scan rates requires accurate and controlled acceleration, deceleration and translation of the substrate holder. Each acceleration and deceleration event of the substrate holder is generated by a motor or other moving force generator. As well as generating the desired substrate holder motion, an undesirable vibration in reaction to the movement occurs.

Referring again to FIG. 1, the illustrated raster pattern will first require the substrate and substrate holder to be accelerated in the horizontal (x) direction to a constant speed before the leading edge of the substrate reaches the ion beam. The substrate is then scanned through the beam at constant speed. Once the trailing edge is clear of the ion-beam, there follows a short deceleration period, and subsequently, or concurrently, the substrate holder is moved downwards (y direction) so that the reverse scan may be performed. Thus, there are acceleration and deceleration events in the horizontal direction, and similar events due to the stepwise movement in the vertical direction. Each of these events is likely to cause vibration.

US Patent Application published as US2004/0194565 describes a substrate scanner and semiconductor manufacturing apparatus. FIG. 2a shows schematically the substrate scanner disclosed in this document. The scanner comprises a tiered structure that has a substrate mounted on a carriage 120 that is, in turn, mounted on a reaction mass 100 that, in turn, is mounted on a base 140. To effect scanning, the carriage 120 (and hence substrate) is moved in the desired direction. At the same time, the reaction mass 100 moves in the opposite direction to provide a reaction force. In this document, the substrate carriage 120 is referred to as the "processing base", the reaction mass 100 is referred to as the "moveable base" and the base 140 is referred to as the "fixed base". While this arrangement reduces vibration, there remain a number of problems.

The substrate carriage 120 runs on guides on the reaction mass 100. To provide the necessary range of movement of the substrate relative to the ion beam, the reaction mass 100 must be longer than the amount of movement required by the substrate carriage 120, resulting in a bulky design.

Additionally, the reaction mass 100 moves in the opposite direction to the substrate carriage 120, as shown in FIGS. 2b and 2c. If the reaction mass 100 moves the same distance as the substrate carriage 120, then the reaction mass 100 will need to be as long as around twice the length of movement required by the substrate carriage 120, thereby adding to the bulk of the substrate scanner. Furthermore, if a similar implementation is used for each of the two orthogonal directions required to scan across a substrate, the consequent size of the substrate scanner will be further increased.

Mounting one movable device on top of another, such as mounting the movable substrate carriage 120 on top of the reaction mass 100, results in additional complexity in routing wiring and circuitry as well as requiring complex algorithms to generate the overall required movement of the substrate.

The present invention addresses the above described problems of the prior art and provides an improved substrate scanning apparatus.

SUMMARY OF THE INVENTION

The present invention provides substrate scanner apparatus for scanning a substrate through an ion beam in an ion implanter, the substrate scanner apparatus comprising: a base; a substrate carriage arranged to move along a first path provided by the base, the substrate carriage being coupled to a substrate holder such that the substrate holder and any substrate held by the substrate holder moves with the substrate carriage; a reaction mass carriage arranged to move along a second path provided by the base; and means for controlling movement of the substrate carriage and reaction mass carriage such that movement of the substrate carriage causes a corresponding movement of the reaction mass carriage in the reverse direction thereby counteracting reaction forces generated by movement of the substrate carriage.

When scanning, the substrate carriage and reaction mass carriage move in mutual reciprocation, that is, when the substrate carriage is driven in a given direction, the reaction mass carriage is driven in the opposite direction.

The back and forth reciprocating movement of the substrate carriage generates vibration caused by the reaction forces of the driving motor. For example, at the start of a scan the substrate carriage will initially be accelerated from rest to a constant velocity. During acceleration the base will experience a reaction force in the opposite direction to the movement of the substrate carriage. Unless corrected, this would lead to a vibration. This vibration is substantially eliminated by using the reaction mass carriage driven in mutual reciprocation to the substrate carriage.

The base may be fixed to a rigid structure in the ion implanter such as a process chamber wall. In alternative embodiments, the base may itself be mounted on a stepwise scanner that provides movement in a direction orthogonal to the back and forth reciprocating movement. Nonetheless, the base is static in respect of the direction of motion of the carriages.

The substrate scanner apparatus may further comprise a first moving force generation unit adapted to provide a movement generating force between the one of the carriages and the base. Preferably, the force is provided to the substrate carriage. In this case, the substrate scanner apparatus may further comprise a second moving force generation unit adapted to provide a movement generating force between the reaction mass carriage and the base.

The means for controlling the movement of the substrate carriage and reaction mass carriage may comprise many different arrangements. For example, the means for controlling movement may be a link that links movement of one carriage to the other carriage. The link may be entirely physical in nature, or it may comprise a part that performs a calculation to relate movement of one carriage to the other. Possible arrangements will now be explained.

The link may comprise a controller arranged to send signals to moving force generation units on each of the carriages. Such a controller may calculate the motion required of both carriages to achieve the counteracting reaction forces. The controller may then send signals to the moving force generation units, it being understood that this arrangement requires each carriage to have an associated moving force generation unit. Alternatively, the controller may send signals to only a single moving force generation unit, movement of the other carriage being effected in response by a feedback loop.

Where only a single moving force generation unit is used, the link may be physical such that the carriages are mechanically coupled together to provide the corresponding movement in opposed directions. The link may comprise any of chains, belts, pulleys, gears, linkage arms, hydraulic or pneumatic circuits, etc.

The first moving force generating unit may include a first motor mounted to the substrate carriage, and if fitted, the second moving force generation unit may include a second motor mounted to the reaction mass carriage. Alternatively, the first motor may be mounted to the base, and/or the second motor may be mounted to the base. The motors may be linear motors.

The moving mass of the substrate holder assembly (that is the mass of everything that is supported by and moves with the substrate carriage) may be equal to the moving mass of the reaction mass assembly (that is the mass of the reaction mass carriage and reaction mass and any other part that moves with the reaction mass carriage). In such a case, the equal masses mean that the movement of the reaction mass carriage is equal in magnitude but in the opposite direction to the substrate carriage.

The substrate scanner may further comprise a controller, wherein the substrate holder assembly and reaction mass assembly have a collective centre of mass, and the controller controls the movement of the substrate holder carriage and reaction mass carriage to maintain the collective centre of mass in a fixed position.

In an alternative embodiment, the moving mass of the substrate holder assembly has a mass m1 that is less than the moving mass of the reaction mass assembly m2. The amount of movement of the reaction mass carriage is less than the amount of movement of the substrate carriage by a factor given by the ratio m1/m2. A reduction in the movement of the reaction mass is thereby achieved.

Any of the above mentioned embodiments of substrate scanner apparatus may further comprise a first and, optionally, a second position sensor such that the first position sensor is adapted to monitor the position of the substrate carriage along the first path and send a signal based on the position to a controller, and the second position sensor is adapted to monitor the position of the reaction mass carriage along the second path and send a signal based on the position to a controller.

The substrate scanner apparatus may further comprise one or more position encoders, the position encoders being adapted to receive from a controller instructions which the encoders use to provide signals to the moving force generating units to move the carriages the required distance.

Ion implanters often require movement of a substrate in two orthogonal directions to scan the whole of the substrate through the ion beam. To achieve this, two substrate scanner apparatuses may be provided, one for each orthogonal direction of movement. The first substrate scanner may be mounted to the wall of the ion implanter, and the second may be mounted to the first substrate scanner. The second substrate scanner may be adapted to support the substrate holder. In both cases, the base will be static relative to its associated direction of motion of the carriages.

The present invention also provides an ion implanter comprising any of the substrate scanner apparatus described herein. The ion implanter may further comprise a controller for controlling the movement of the carriages, movement of the substrate carriage being controlled to scan the substrate through the ion beam, and movement of the reaction mass carriage being controlled to counteract reaction forces due to movement of the substrate carriage.

Additionally, the present invention provides a method of scanning a substrate through an ion beam in an ion implanter, the method comprising the steps of: moving a substrate carriage along a first path provided by a base, the substrate carriage being coupled to a substrate holder such that the substrate holder and any substrate held by the substrate holder moves with the substrate carriage; and moving a reaction mass carriage along a second path provided by the base, such that the substrate carriage causes a corresponding movement of the reaction mass carriage in the opposite direction thereby counteracting reaction forces generated by movement of the substrate carriage.

Other preferred features of the method of scanning a substrate are presented in the appended claims. In addition, the method may be used with any of the preferred arrangements described above in relation to the substrate scanner apparatus, for example details relating to where the moving force generating units are located or to what the guide may correspond.

The present invention also extends to a controller, that may be a computer, arranged to implement any of the methods described above. The present invention also extends to a corresponding computer program and a corresponding computer readable medium.

BRIEF DESCRIPTION OF THE DRAWINGS

Embodiments of the present invention, along with aspects of the prior art, will now be described with reference to the accompanying drawings, of which:

FIG. 9 shows a second contemplated position for the substrate scanner in the ion implanter.

DETAILED DESCRIPTION OF THE INVENTION

Figure 1:
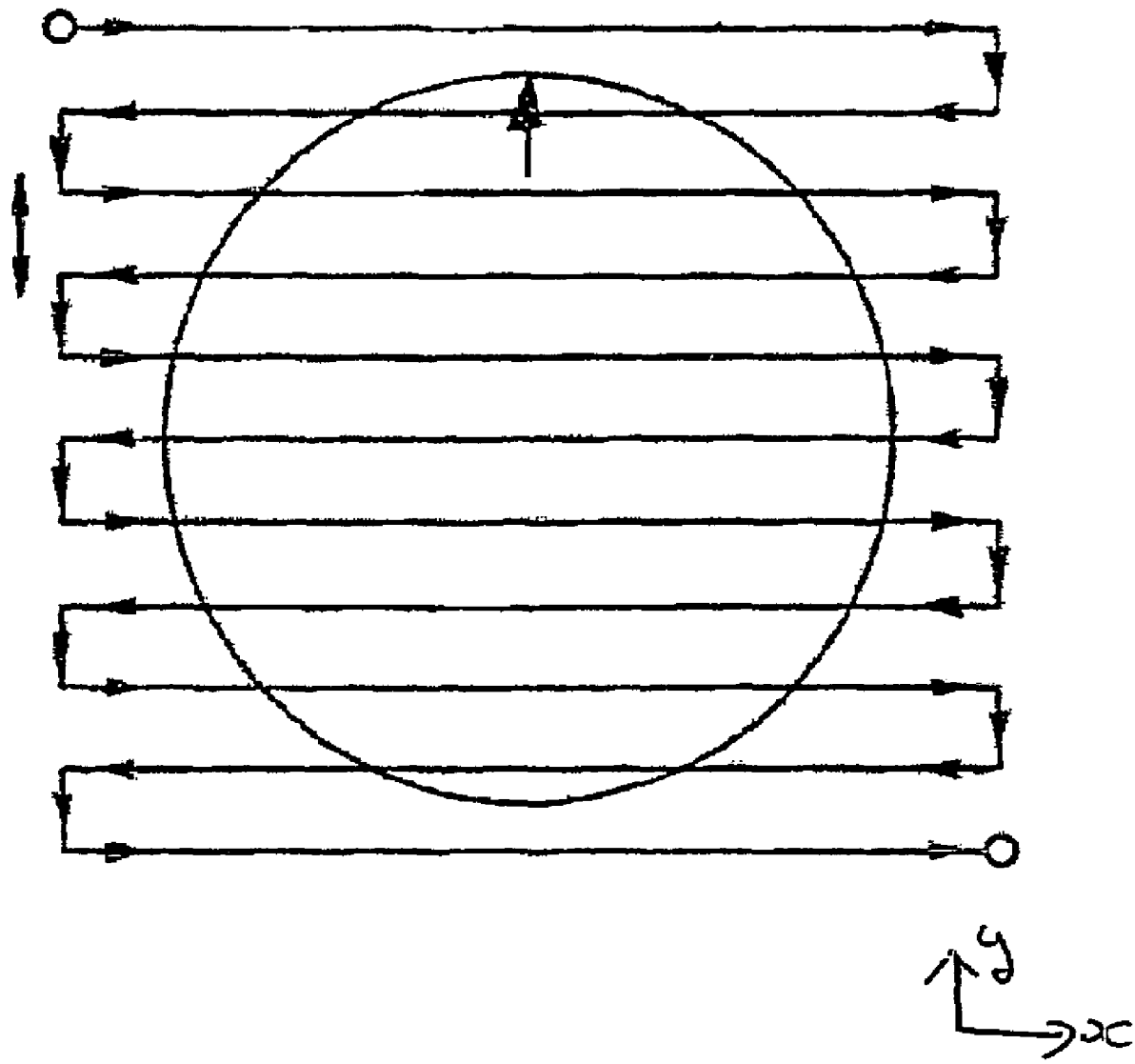
FIG. 1 illustrates a raster scan pattern of an ion beam across a wafer.
Figure 2:
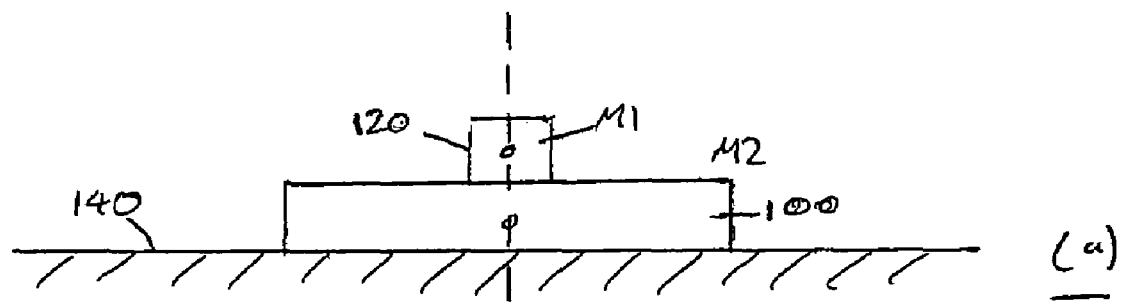
FIGS. 2a-2c illustrate the configuration and movement of a conventional substrate scanner.
Figure 2:
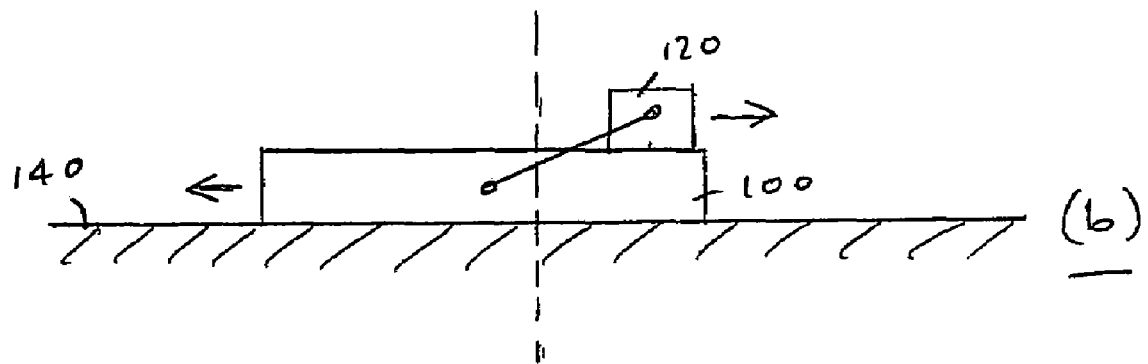
Figure 2:
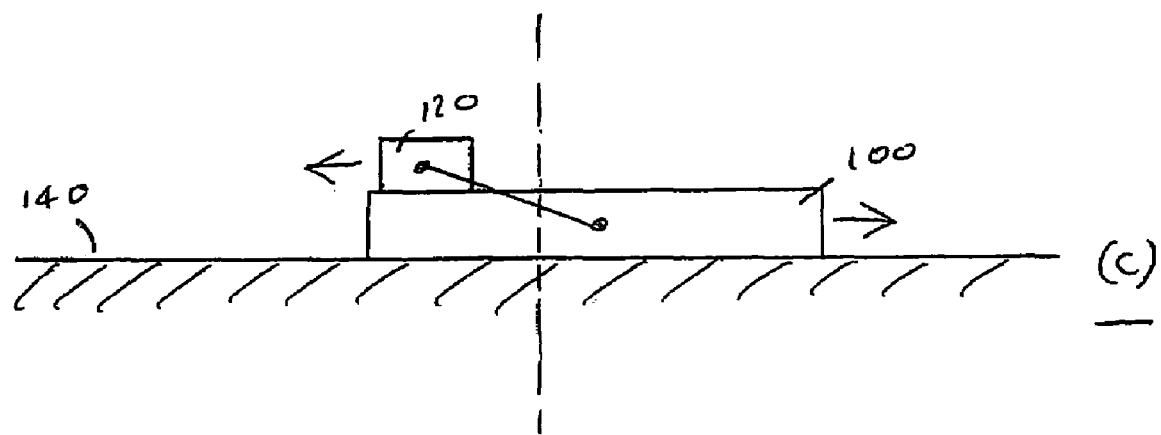
Figure 3:
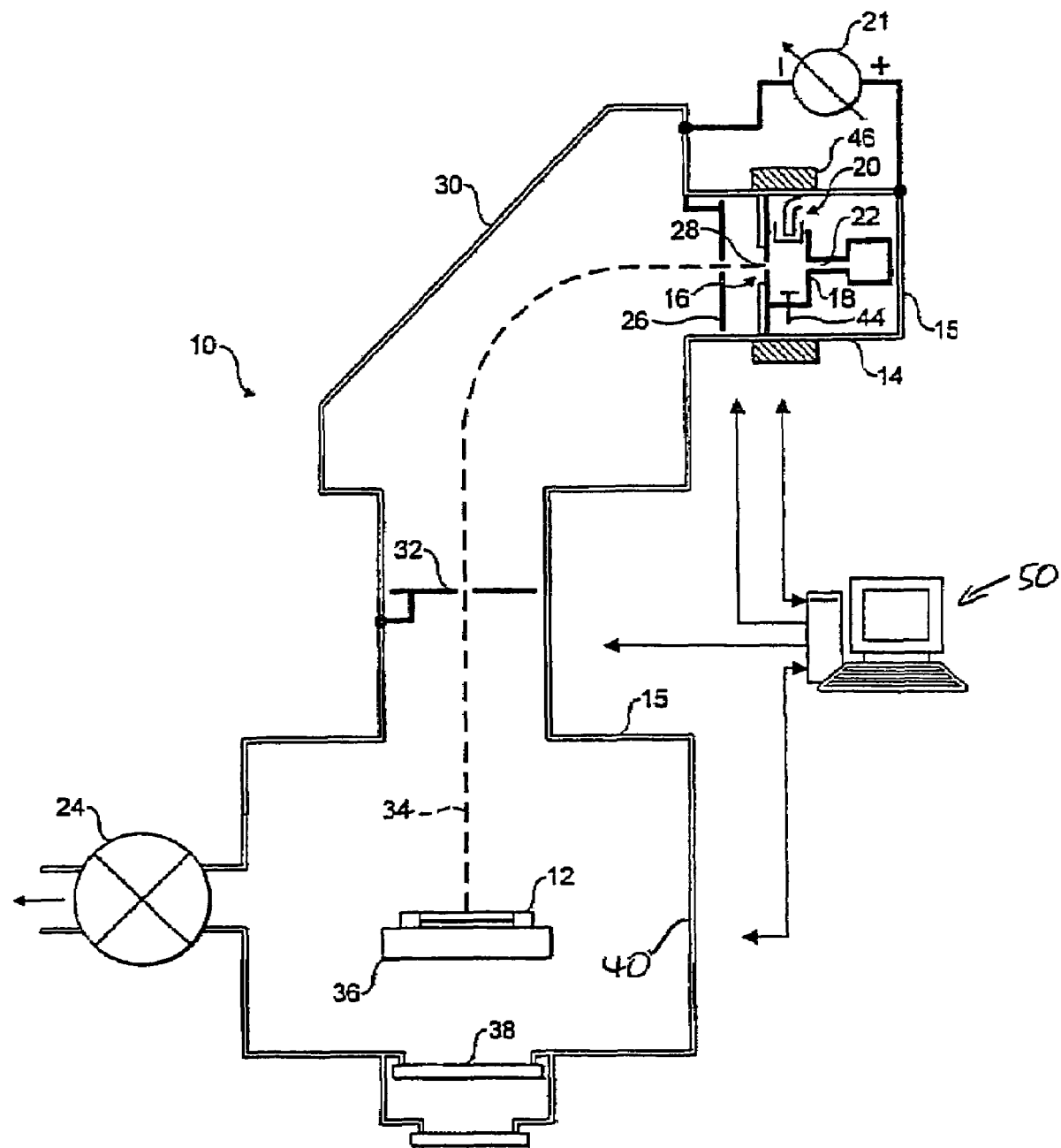
FIG. 3 shows a conventional ion implanter.

In order to provide a context for the present invention, an exemplary application is shown in FIG. 3, although it will be appreciated that this is merely an example of an application of the present invention and is in no way limiting.

FIG. 3 shows a known ion implanter 10 for implanting ions in substrates 12 such as semiconductor wafers. Ions are generated by the ion source 14 to be extracted and follow an ion path 34 that passes, in this embodiment, through a mass analysis stage 30. Ions of a desired mass are selected to pass through a mass-resolving slit 32 and then to strike the substrate 12.

The ion implanter 10 contains an ion source 14 for generating an ion beam of a desired species that is located within a vacuum chamber 15 evacuated by pump 24. The ion source 14 generally comprises an arc chamber 16 containing a cathode 20 located at one end thereof. The ion source 14 may be operated such that an anode is provided by the walls 18 of the arc chamber 16. The cathode 20 is heated sufficiently to generate thermal electrons.

Thermal electrons emitted by the cathode 20 are attracted to the anode, the adjacent chamber walls 18 in this case. The thermal electrons ionise gas molecules as they traverse the arc chamber 16, thereby forming a plasma and generating the desired ions.

The path followed by the thermal electrons may be controlled to prevent the electrons merely following the shortest path to the chamber walls 18. A magnet assembly 46 provides a magnetic field extending through the arc chamber 16 such that thermal electrons follow a spiral path along the length of the arc chamber 16 towards a counter-cathode 44 located at the opposite end of the arc chamber 16.

A gas feed 22 fills the arc chamber 16 with the species to be implanted or with a precursor gas species. The arc chamber 16 is held at a reduced pressure within the vacuum chamber 15.

Thermal electrons ionise the gas molecules present in the arc chamber 16 and may also crack molecules. The ions (that may comprise a mixture of ions) created in the plasma will also contain trace amounts of contaminant ions (e.g. generated from the material of the chamber walls 18).

Ions from within the arc chamber 16 are extracted through an exit aperture 28 provided in a front plate of the arc chamber 16 using a negatively-biased (relative to ground) extraction electrode 26. A potential difference is applied between the ion source 14 and the following mass analysis stage 30 by a power supply 21 to accelerate extracted ions, the ion source 14 and mass analysis stage 30 being electrically isolated from each other by an insulator (not shown). The mixture of extracted ions are then passed through the mass analysis stage 30 so that they pass around a curved path under the influence of a magnetic field. The radius of curvature traveled by any ion is determined by its mass, charge state and energy, and the magnetic field is controlled so that, for a set beam energy, only those ions with a desired mass to charge ratio and energy exit along a path coincident with the mass-resolving slit 32. The emergent ion beam is then transported to the process chamber 40 where the target is located, i.e. the substrate 12 to be implanted or a beam stop 38 when there is no substrate 12 in the target position. In other modes, the beam may also be accelerated or decelerated using a lens assembly positioned between the mass analysis stage 30 and the substrate position.

The substrate 12 is mounted on a substrate holder 36 according to the present invention, substrates 12 being successively transferred to and from the substrate holder 36, for example by a robot using a load lock (not shown).

The ion implanter 10 operates under the management of a controller, such as a suitably programmed computer 50. The computer 50 controls scanning of the wafer 12 through the ion beam 34 to effect desired scanning patterns. These scanning patterns may comprise raster scans, including interlaced patterns, as is well known in the art.

Figure 4:
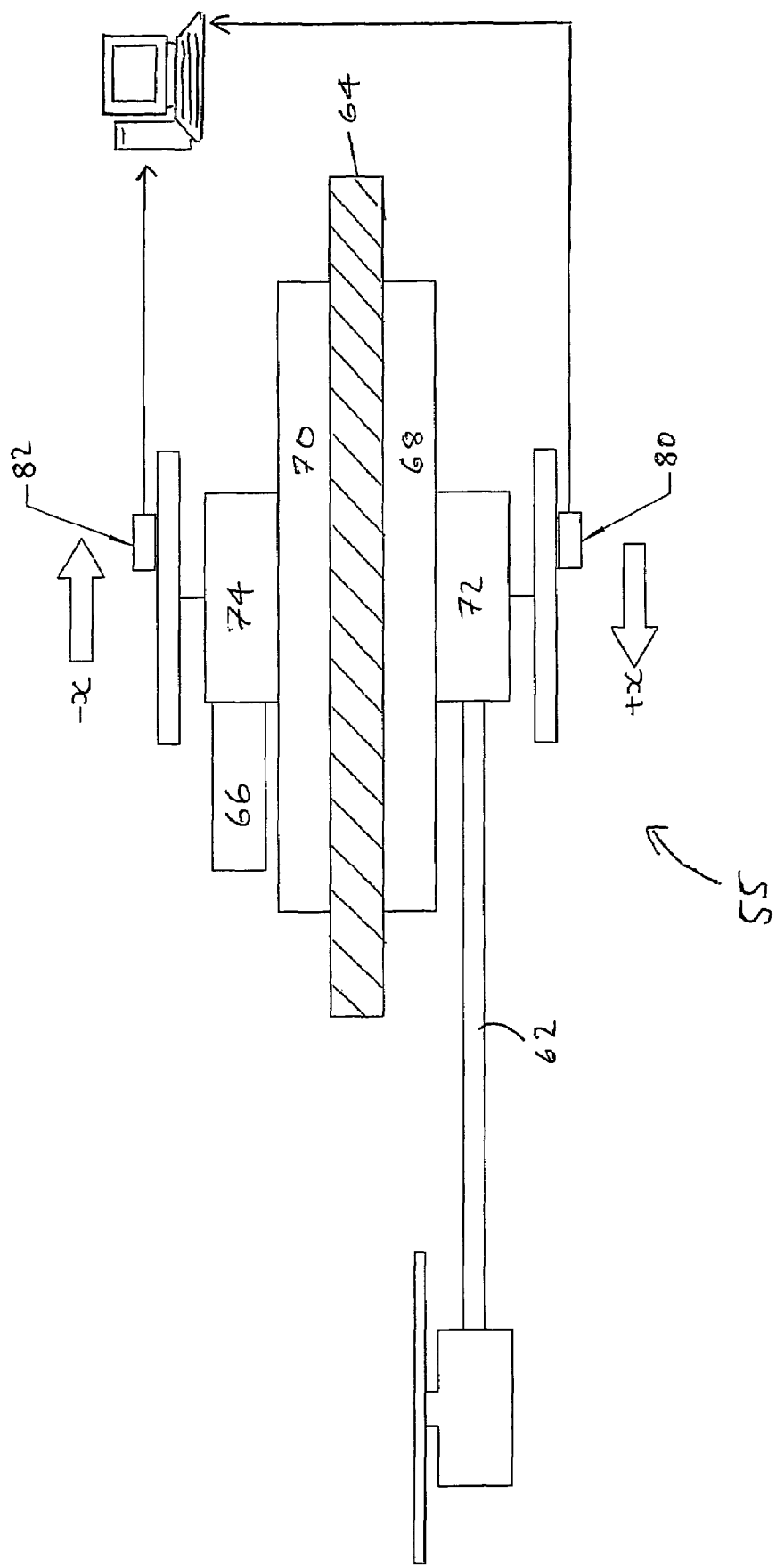
FIG. 4 is schematic illustration of a substrate scanner according to an embodiment of the present invention.

FIG. 4 shows a substrate scanning apparatus 55 for moving the substrate across the ion beam 34 to achieve desired scanning patterns. The substrate scanning apparatus 55 comprises a fixed base 64 that may be rigidly mounted, for example, to the process chamber 40 of the ion implanter 10. The base 64 includes first and second guides 68, 70 along which first and second carriages 72, 74 respectively may move. The first carriage 72, from here onwards referred to as the substrate carriage, carries a shaft that supports a substrate holder 36. The substrate carriage 72 may be provided with wheels or rollers to be guided by first guide 68. The guide 68 may comprise rails or a trench that constrain movement of the substrate carriage 72. The second carriage 74, or reaction mass carriage, carries a mass 66. The reaction mass carriage 74 may also be provided with wheels or rollers to be movable as guided by second guide 70. Each of the carriages 72, 74 are provided with motors, housed within each carriage 72, 74. Primary control to the motors is provided by controller 50. Encoders 80, 82 receive signals from the controller 50 and, in accordance with these signals, supply power to the motors. The power is supplied to the motors when the signals from the controller 50 instruct the encoders 80, 82 to move the carriages 72, 74.

Although the embodiment illustrated in FIG. 4, shows the path of the carriages 72, 74 being controlled by guides, other embodiments are considered in which the carriages 72, 74 merely roll across the base 64 as steered by their wheels or rollers. For example, the wheels or rollers may be fixed to constrain the carriages 72, 74 to move in a straight line. Other suitable choices for guides 68, 70 are pulleys, rails, chain or belts etc.

As mentioned above, the substrate carriage 72 carries a shaft 62 supporting the substrate holder 36. The substrate carriage 72 is moved back and forth to scan the substrate 12 across the ion beam 34.

There follows a description of the motion of the substrate carriage 72, and of how vibration caused by the motion of the substrate carriage 72 is counteracted by the reciprocal motion of the reaction mass carriage 74. As shown in FIG. 4, when the substrate holder 36 and carriage 72 are driven in the +x direction, the reaction mass carriage 74 is driven in the opposite direction i.e. the −x direction.

In this embodiment, the moving mass of the reaction mass assembly (i.e. the reaction mass carriage 74 and reaction mass 66) is equal to the moving mass of the substrate holder assembly (i.e. the combined mass of the substrate carriage 72, holder 36, shaft 62 and any other components mounted to the carriage 72 or holder 36). The reaction mass carriage 74 travels at equal speeds to the substrate carriage 72. The reaction force on the fixed base 64 imparted by movement of the reaction mass carriage 74 should ideally balance the reaction force imparted by the substrate carriage 72.

Figure 5:
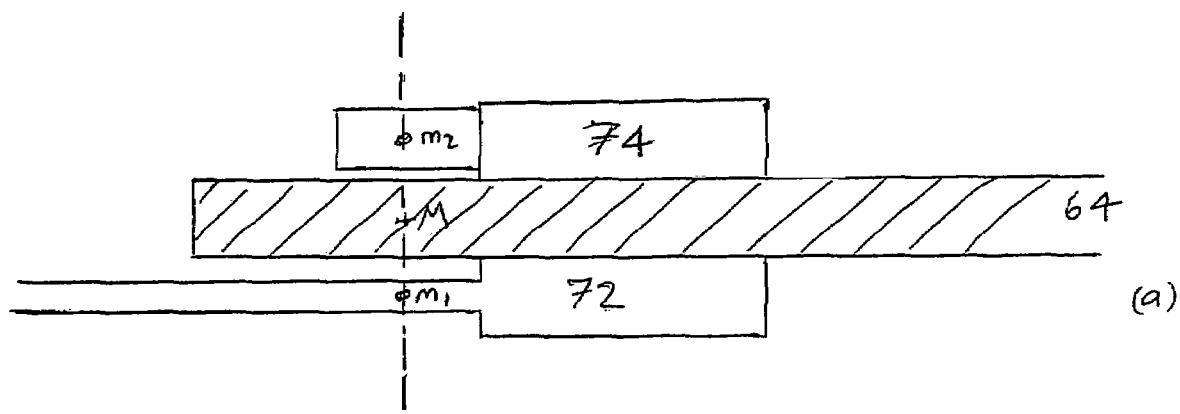
FIGS. 5a-5c show movement of the substrate scanner when used in accordance with an embodiment of the present invention.
Figure 5:
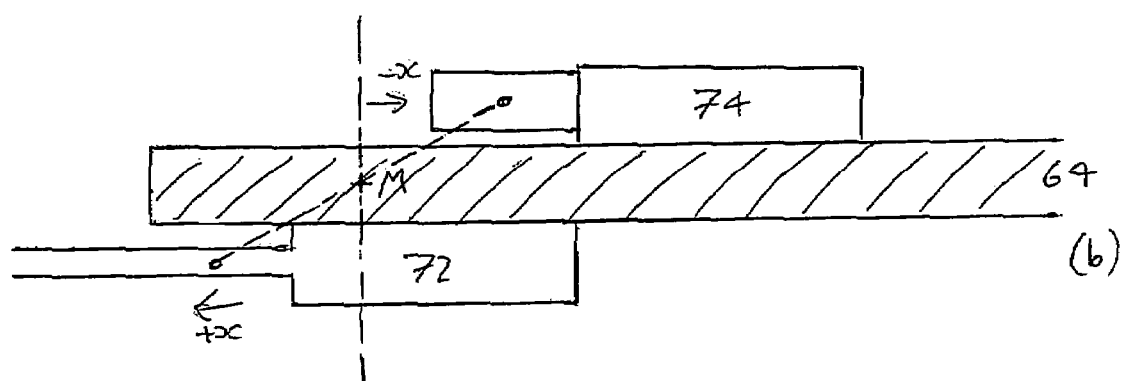
Figure 5:
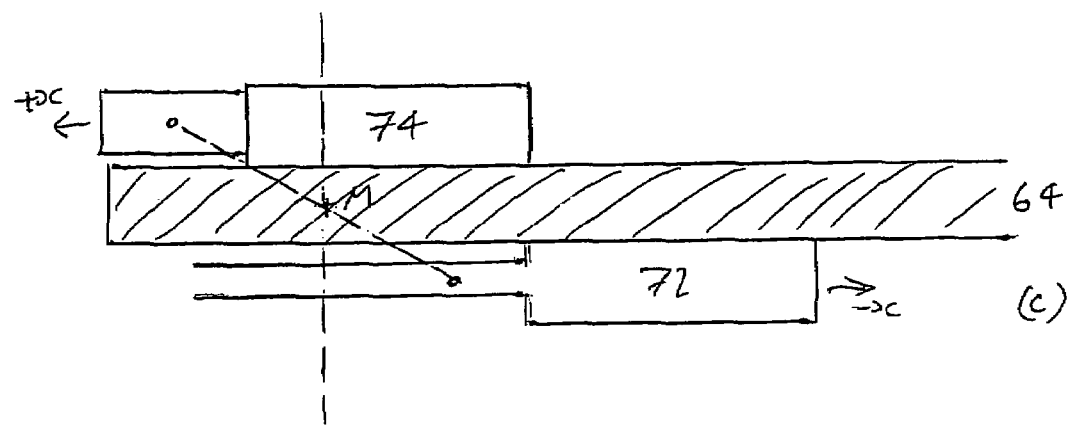

FIG. 5 shows in more detail how the reaction mass carriage 66 may move in order to minimise vibration. FIG. 5a shows the base 64, substrate carriage 72 and reaction mass carriage 74. The centre of mass m1 of the moving mass of the substrate holder assembly is shown just to the left of the substrate carriage 72. The centre of mass m2 of the moving mass of the reaction mass assembly is also shown just to the left of the reaction mass carriage 74. If the moving masses are equal, the collective centre of mass M will be at a point half way along a line between the centres of mass m1 and m2.

FIG. 5b shows that the substrate carriage 72 has moved in the +x direction. The reaction mass carriage 74 has also moved. To compensate for vibration, the reaction mass carriage 74 moves an equal amount as the substrate carriage 72 but in the opposite direction. The movement of both carriages 72, 74 will be synchronised to occur at the same time with equal speed and acceleration but in opposite direction. As a result the reaction force exerted by the reaction mass carriage 74 on the base 64 will be equal in magnitude as the reaction force exerted by the substrate carriage 72 on the base 64. These two reaction forces will be in opposite direction resulting in a total reaction force of zero on the base. Moreover, the collective centre of gravity M will not move even though the carriages 72, 74 are moving. Since the total reaction force on the fixed base 64 will be zero and no movement of the centre of gravity occurs no vibration will be transmitted from the fixed base 64 to the surroundings such as the ion implanter 10.

Similarly, FIG. 5c shows movement of the substrate carriage 72 in the −x direction and reciprocal movement of the reaction mass carriage 74. Again, the speed and acceleration of the two carriages 72, 74 are matched to be equal in magnitude and opposite in direction at any given point in time.

Figure 6:
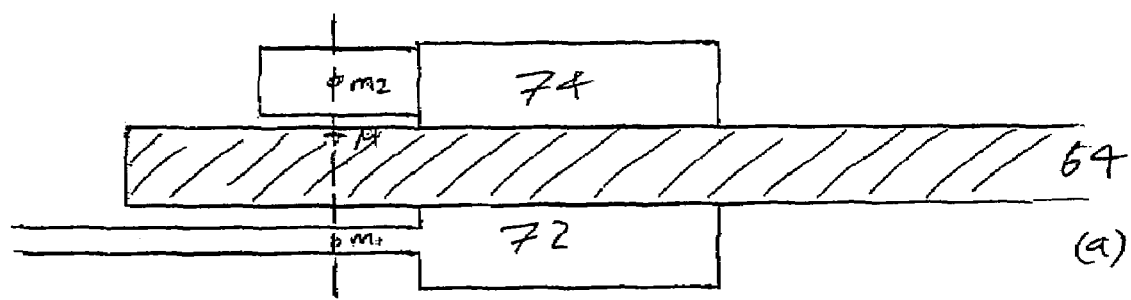
FIG. 6a-6c show movement of the substrate scanner in accordance with a further embodiment of the present invention.
Figure 6:
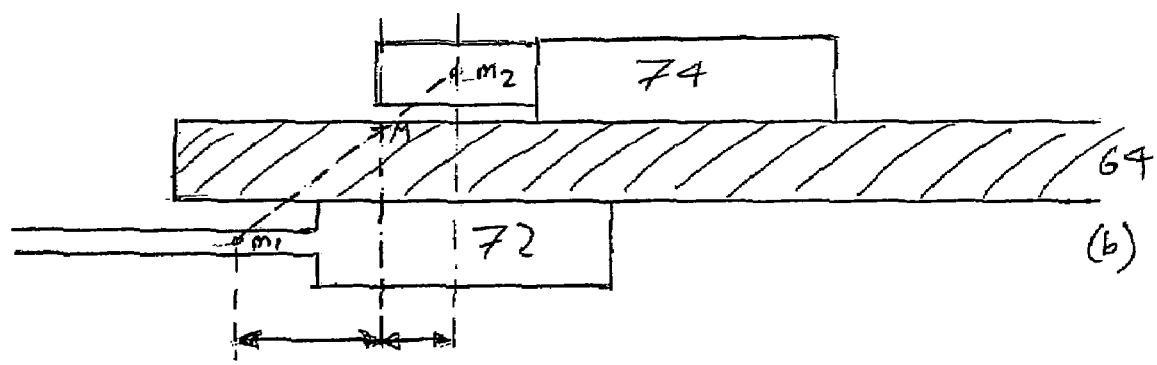
Figure 6:
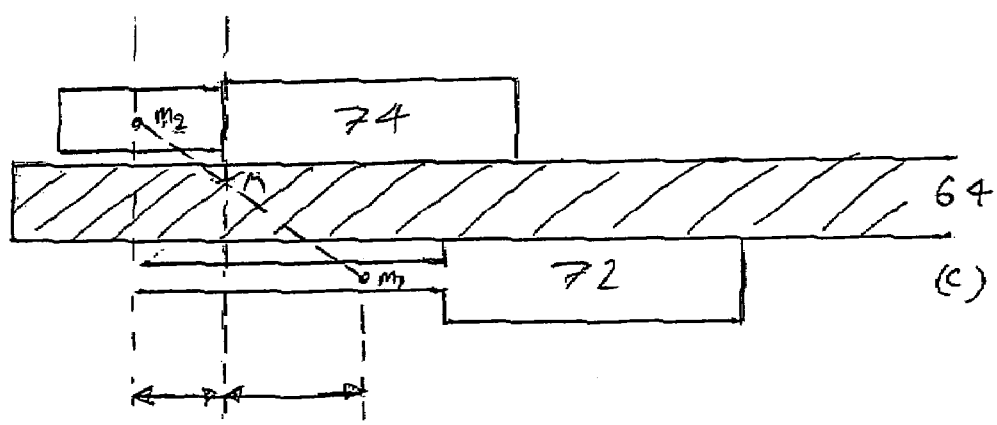

In an alternative embodiment, the moving mass of the reaction mass assembly (reaction mass 66 and carriage 74) may be greater or less than the moving mass of the substrate holder assembly. For example, if the moving mass of the reaction mass assembly is twice that of the substrate holder assembly, then the reaction mass carriage 74 will not need to be accelerated as fast as the substrate carriage 72 to impart an equal and opposite reaction force. FIG. 6 shows the case where the reaction mass carriage assembly has a moving mass twice that of the substrate holder and carriage assembly. At a central rest point, the collective centre of mass M will be two-thirds of the way along the line between the centre of masses m1 and m2. When the substrate carriage 72 is moved, the reaction mass carriage 74 must move with half the acceleration and velocity to provide equal and opposite reaction forces on the fixed base 64. Again, the collective centre of mass will not move even though the two carriages 72, 74 move, as shown in FIGS. 6b and 6c. This embodiment has the advantage that the reaction mass carriage 74 does not need to move as far and hence the guide 70 can be shorter.

The embodiment shown in FIG. 4 uses motors to drive the carriages 72, 74 along guides 68, 70. These motors should have a direct and reproducible relationship between the amount of motion provided by the motor and the power supplied to it. The motors are provided in the carriages 72, 74, and drive the respective carriage 72, 74 along the guide 68, 70, perhaps using a rack and pinion arrangement with the rack being mounted to the guide 68, 70 and the pinion being driven by the motor. Alternatively, the motors may be attached to the base 64. Again, a rack and pinion arrangement may be used, but the rack would be located on the carriage 72, 74 and be driven by the pinion located on the base.

In another embodiment, the motors may be linear motors directly providing linear motion. The linear motors comprise an array of magnets and a coil which, when energised, causes repulsive or attractive forces between the magnets and coil. The repulsive or attractive force is used to move one or both carriages. The coil may be fixed to a carriage 72 or 74 and the magnet may move with the base 64. Alternatively, the coil may move with the base 64 and the magnet may be fixed to a carriage 72 or 74. Both the reaction mass carriage 74 and substrate carriage 72 may have the same coil-magnet arrangement, or they may have different arrangements. For example, the coil may be fixed to the base 64 and the magnets may be mounted to the reaction mass carriage 74, whereas the magnets may be mounted to the substrate carriage 74 and the magnets may be fixed to the base 64, or vice versa.

In further embodiments, each carriage 72, 74 may be driven by a pulley arrangement, leadscrew arrangement, or by hydraulic or fluid pressure. However, the preferred embodiments use either a normal electric motor having a linear conversion between input power and the amount of rotation, or a linear motor that provides linear motion directly. Nevertheless, the skilled person would be aware of other motion generation means and easily substitute them for the linear motors without inventive activity.

In the described embodiments, the motion of the substrate carriage 72 and reaction mass carriage 74 may be controlled by a controller, such as computer 50 or a suitably programmed electronic device. The movement of the carriages 72, 74 may be performed in a number of ways. For example, the computer 50 or other controller may actively control each of the carriages 72,74 by sending signals to the position encoders 80, 82. For example, the computer 50 may determine the required motion of the substrate carriage 72, calculate the required compensating motion of the reaction mass carriage 74, and send corresponding signals to the position encoders 80, 82 to actuate the motors to effect these determined motions. Alternatively, the computer may control actively the movement of the substrate carriage 72, and the reaction mass carriage 74 may move in reaction to it, e.g. by using a feedback loop detecting the movement of the substrate carriage 72 and sending signals to the moving force generation unit on the reaction mass carriage 74 to move the reaction mass carriage 74 accordingly. Alternatively, a mechanical coupling may be used to cause the reaction mass carriage 74 to move in reaction to movement of the substrate carriage 72. The mechanical coupling maybe of any conventional design, e.g. using a pulley, gear, beam or hydraulics. The advantage of the mechanical coupling is that only one motion generation unit is needed.

Figure 7:
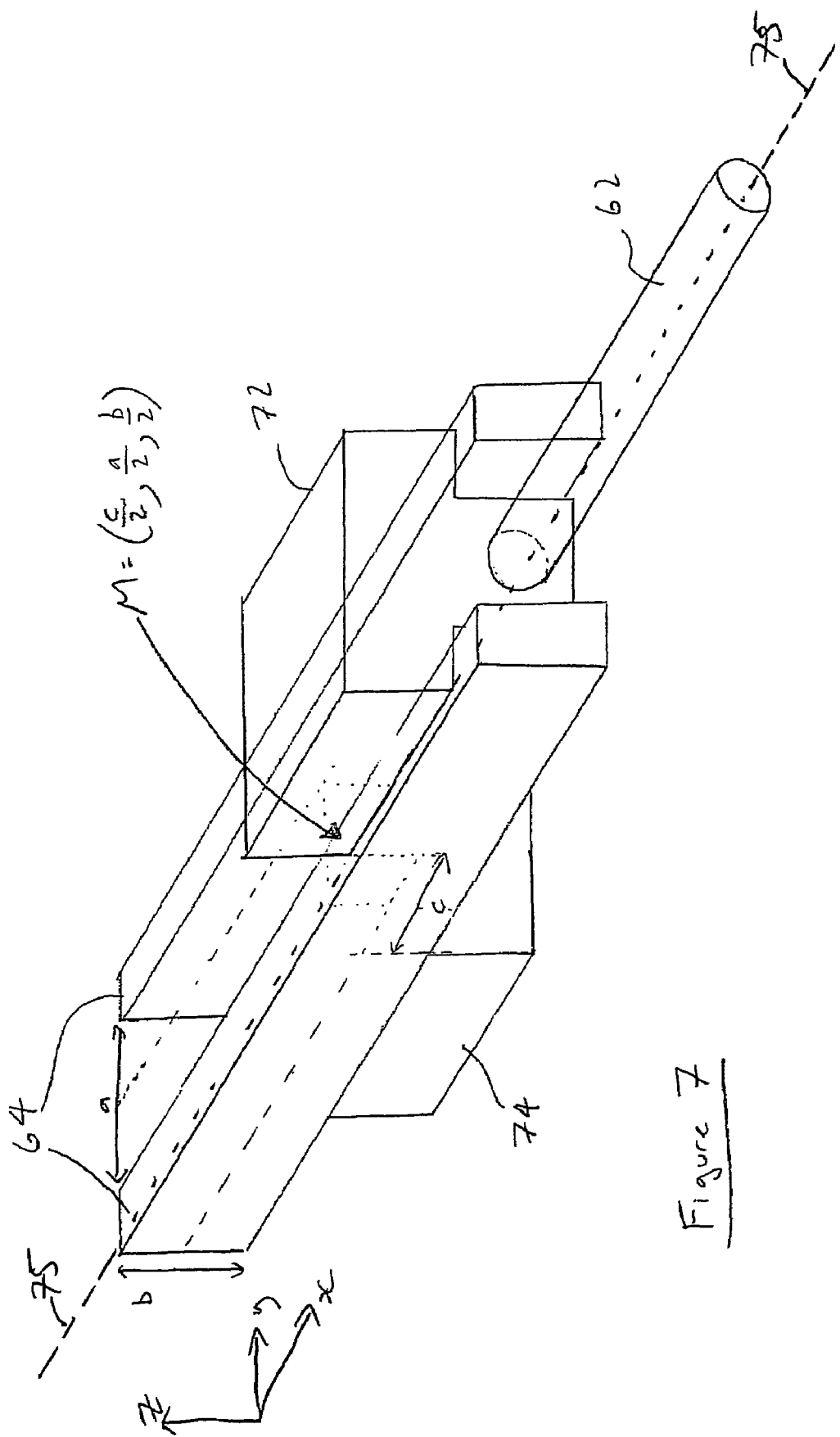
FIG. 7 is a detailed perspective view of a substrate scanner according to an embodiment of the present invention.

A particular embodiment of the present invention is shown in FIG. 7. In this embodiment, the substrate carriage 72 and reaction mass carriage 74 run on a base 64 comprised of a pair of rails. As described above, the substrate carriage 72 may be adapted to carry a shaft 62 to support the substrate holder 36. The substrate carriage 72 and reaction mass carriage 74 move in reciprocation along the rails. Preferably, the centre of mass of each of the carriages 72, 74 is located equidistant between the two rails in the y-direction, and at the mid point of the rails in the z direction. In FIG. 7, this is represented by a distance a/2 from the inner edge of the rails, and a distance b/2 from the top of the rails. Moreover, during movement of the carriages 72, 74 the collective centre of mass of both carriages does not move from a fixed point half way between the two carriages (assuming equal moving masses), denoted c/2. A benefit of this design is that the centres of mass for the substrate carriage assembly and the reaction mass assembly move along a common line of action indicated at 75. This prevents any twisting moments otherwise imparted by the centres of mass moving along different lines of action. Advantageously, the substrate holder shaft also extends along the line of action 75.

The position of the carriages 72, 74 may be determined from the number of revolutions of the motors. For example, the encoders 80, 82 will receive instructions from the controller 50, the encoders 80, 82 will convert these instructions into an electrical signal to drive the motors the required distances. However, it is preferable that the scanner device is provided with position sensors. These position sensors may provide feedback to the controller to indicate the position of one or both of the carriages 72, 74.

Figure 8:
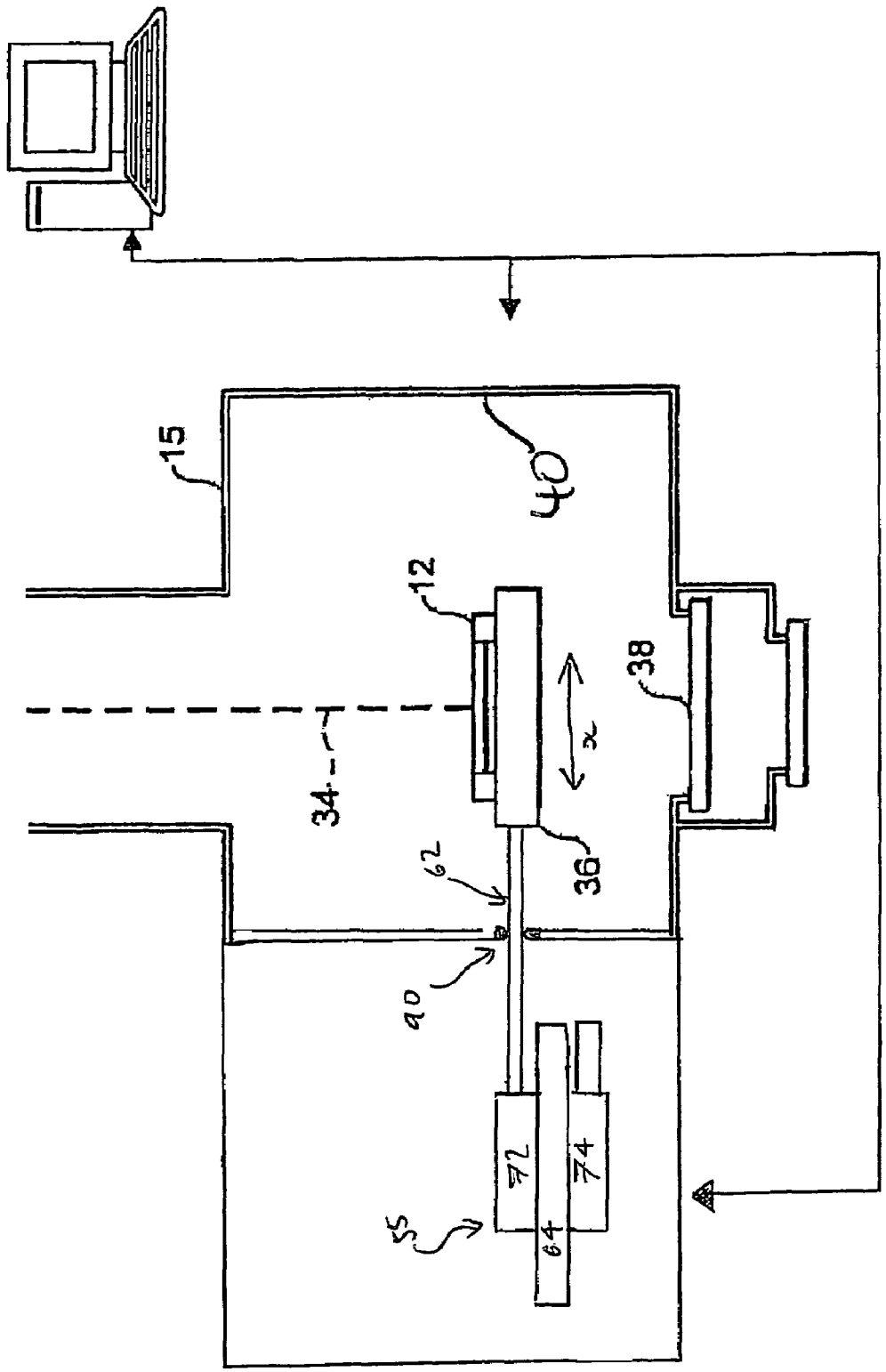
FIG. 8 shows a first contemplated position for the substrate scanner in the ion implanter.

FIG. 8 shows the substrate scanner apparatus 55 in relation to an ion implanter 10. The scanner apparatus 55 is positioned outside of the process chamber 40 with the shaft 62 extending through a sealed bearing 90. Bellows may be used to maintain the vacuum in the process chamber 40 while allowing the shaft 62 to move in and out of the process chamber 40.

The substrate scanner apparatus shown in FIG. 8 may incorporate two directions of movement such as x and y (y is perpendicular to the plane of the page). Alternatively, a scanner for the x-direction may be located outside of the process chamber 40 and a scanner for the y-direction may be located inside of the process chamber 40. In a further alternative embodiment shown in FIG. 9, a scanner apparatus providing both x and y movement may be provided in the process chamber 40. In such a case, there may be provided two scanner apparatuses. The first scanning apparatus provides movement in a first direction (for example, the y-direction) with a reaction mass compensating for reaction forces. The second scanning apparatus provides movement in a second direction (for example, the x-direction). A reaction mass also compensates for reaction forces in this direction. The first substrate scanning apparatus may be fixed to the wall of the ion implanter. The second scanning apparatus may be mounted on the "substrate carriage" of the first scanner apparatus. The substrate holder 36 may be mounted to or supported from the substrate carriage 72 of the second scanner apparatus. The moving mass of the reaction mass carriage of the first scanner apparatus must compensate for the y-direction movement of the substrate holder 36 and complete second scanner apparatus. Hence, the reaction mass of the first scanner apparatus will be larger than that for the second apparatus.

The skilled person will appreciate that changes may be made to the above-described embodiments without departing from the scope of the present invention defined by the appended claims.

For example, the substrate may be scanned in many different ways other than the raster scan described. For example, interlaced scanning or circular scanning may be used. Our U.S. patent application Ser. No. 11/417,028 provides examples.

The substrate carriage 72 and reaction mass carriage 74 described above run on wheels or rollers. However, alternative movement means may provided, such as hydraulics or pistons that push the carriages 72, 74 along the paths, or a maglev-style system in which the carriages 72, 74 are driven using a linear array of magnets provided along the guides. Optionally, air bearings may be used to reduce the friction between surfaces in, for example, an arrangement using linear motors.

Furthermore, the above embodiments describe the substrate carriage 72 and reaction mass carriage 74 on opposite sides of a base 64. However, many alternatives are possible such as carriages driven along paths that are side by side or back to back on the fixed base 64, or carriages that run telescopically with one carriage passing though a bore provided in the other carriage. The last two arrangements should provide a better balance of reaction forces as the centre of mass of each carriage will travel along a common line of action.

The invention claimed is:

1. A substrate scanner apparatus for scanning a substrate through an ion beam in an ion implanter, the substrate scanner apparatus comprising:
   a base which defines first and second paths;
   a substrate carriage positioned to move along said first path, the substrate carriage being coupled to a substrate holder such that the substrate holder, and any substrate held by the substrate holder, moves with the substrate carriage;
   a reaction mass carriage positioned to move along said second path provided by the base;
   means for controlling movement of the substrate carriage and the reaction mass carriage such that movement of the substrate carriage along said first path causes a corresponding movement of the reaction mass carriage along said second path in a reverse direction to movement direction of said substrate carriage, thereby counteracting reaction forces generated by movement of the substrate carriage,
   a first moving force-generation unit for providing a movement-generating force between either the substrate carriage and the base or the reaction mass carriage and the base, and
   wherein the means for controlling movement controls movement of the carriage provided with the movement-generating force, and the means for controlling movement comprises a physical link between the substrate carriage and the reaction mass carriage for providing a corresponding movement of the other of the substrate carriage and the reaction mass carriage in the reverse direction.

2. The substrate scanner apparatus of claim 1, further comprising a first moving force-generation unit for providing a movement-generating force between the substrate carriage and the base, and a second moving force-generation unit for providing a movement-generating force between the reaction mass carriage and the base.

3. The substrate scanner apparatus of claim 1, wherein the first moving force-generating unit is mounted to the substrate carriage.

4. The substrate scanner apparatus of claim 2, wherein the second moving force-generating unit is mounted to the reaction mass carriage.

5. The substrate scanner apparatus of claim 1, wherein the first moving force-generating unit is mounted to the base.

6. The substrate scanner apparatus of claim 2, wherein the second moving force-generating unit is mounted to the base.

7. The substrate scanner apparatus of claim 3, wherein the first or second moving force-generating unit is a motor.

8. The substrate scanner apparatus of claim 1, wherein the base includes a first guide which defines said first path and a second guide which defines said second path.

9. The substrate scanner apparatus claim 8, wherein the first or second guide is a rail, trench, belt, chain or piston.

10. The substrate scanner apparatus of claim 1 comprising:
a substrate holder assembly that comprises the substrate carriage and associated parts that move with the substrate carriage; and
a reaction mass assembly that comprises the reaction mass carriage and associated parts that move with the reaction mass carriage; and
wherein the substrate carriage and reaction mass carriage are arranged to move such that respective centres of mass of the substrate holder assembly and the reaction mass assembly move along a common line of action.

11. The substrate scanner apparatus of claim 10, wherein a moving mass of the substrate holder assembly that comprises the substrate carriage and associated moving parts is equal to a moving mass of the reaction mass assembly that comprises the reaction mass carriage and associated moving parts.

12. The substrate scanner apparatus of claim 11, further comprising a controller, wherein the substrate holder assembly and reaction mass assembly have a collective centre of mass, and the controller controls the movement of the substrate carriage and reaction mass carriage to maintain a collective centre of mass in a fixed position relative to the base.

13. The substrate scanner apparatus of claim 11, wherein the moving mass m1 of the substrate holder assembly is less than the moving mass m2 of the reaction mass assembly; and
the amount of movement of the reaction mass carriage is less than the amount of movement of the substrate carriage by a factor given by the ratio of the moving masses m1 and m2.

14. The substrate scanner apparatus of claim 1, further comprising a first position sensor for monitoring a position of the substrate carriage along the first path and send a signal based on the position to a controller.

15. The substrate scanner apparatus of claim 14, further comprising a second position sensor for monitoring a position of the reaction mass carriage along the second path and send a signal based on the position to the controller.

16. The substrate scanner apparatus of claim 1, further comprising a first position encoder adapted to receive instructions from a controller, and to move the substrate carriage in accordance with the instructions.

17. The substrate scanner apparatus of claim 16, further comprising a second position encoder adapted to receive instructions from a controller, and to move the reaction mass carriage in accordance with the instructions.

18. An ion implanter comprising the substrate scanner apparatus of claim 1.

19. The ion implanter of claim 18, wherein the means for controlling movement of the substrate carriage and reaction mass carriage comprises a computer.

20. A method of scanning a substrate through an ion beam in an ion implanter, the method comprising the steps of:
moving a substrate carriage along a first path defined by a base, the substrate carriage being coupled to a substrate holder such that the substrate holder and any substrate it holds moves with the substrate carriage; and
moving a reaction mass carriage along a second path defined by the base, such that movement of the substrate carriage causes a corresponding movement of the reaction mass carriage in a reverse direction thereby counteracting reaction forces generated by movement of the substrate carriage,
wherein a movement-generating force between either the substrate carriage and the base or the reaction mass carriage and the base is provided by a first moving force-generation unit, and
wherein the movement of the carriage that receives the movement-generating force causes a corresponding movement of the other of the substrate carriage and the reaction mass carriage in the reverse direction due to a physical link between the substrate carriage and the reaction mass carriage.

21. The method of claim 20, wherein a movement-generating force between the substrate carriage and the base is provided by a first moving force-generation unit and a movement generating force between the reaction mass carriage and the base is provided by a second moving force-generation unit.

22. The method of claim 20, wherein the substrate carriage is constrained to move along a first path by a first guide, and/or the reaction mass carriage is constrained to move along a second path by a second guide.

23. The method of claim 20, wherein the moving mass of a substrate holder assembly comprising the substrate carriage and associated moving parts is equal to a moving mass of the reaction mass assembly comprising the reaction mass carriage and associated moving parts, the substrate holder assembly and the reaction mass assembly have a collective centre of mass, the method comprising the controller controlling movement of the substrate carriage and reaction mass carriage to maintain the collective centre of mass in a fixed position relative to the base.

24. The method of claim 20, wherein a moving mass m1 of the substrate holder assembly comprising the substrate carriage and associated moving parts is less than a moving mass m2 of the reaction mass assembly comprising the reaction mass carriage and associated moving parts; the method comprising the controller controlling the reaction mass carriage to move less than the amount the substrate carriage moves by a factor given by the ratio of the moving masses m1 and m2.

25. The method of claim 20, wherein a first position sensor monitors the position of the substrate carriage along the first path and sends a signal based on the position to a controller.

26. The method of claim 25, wherein a second position sensor monitors the position of the reaction mass carriage along the second path and sends a signal based on the position to a controller.

27. The method of claim 20, wherein a first position encoder receives from a controller instructions which the encoder uses to move the substrate carriage a first required distance.

28. The method of claim 27, wherein a second position encoder receives from a controller instructions which the second position encoder uses to move the reaction mass carriage a second required distance.

29. A controller arranged to cause an ion implanter to operate in accordance with the method of claim 20.

30. A computer programmed with computer programme code comprising instructions that, when executed, cause an ion implanter to operate according to the method of claim 20.

31. A computer program comprising instructions that, when executed by a computer of an ion implanter, cause the ion implanter to operate to perform the method of claim 20.

32. A computer readable medium carrying a computer program according to claim 31.

* * * * *